United States Patent [19]
Canham et al.

[11] Patent Number: 5,627,382
[45] Date of Patent: May 6, 1997

[54] METHOD OF MAKING SILICON QUANTUM WIRES

[75] Inventors: Leigh-Trevor Canham; John M. Keen; Weng Y. Leong, all of Worcestershire, England

[73] Assignee: The Secretary of State for Defence in Her Britannic Majesty's Government of the United Kingdom of Great Britain and Northern Ireland, London, England

[21] Appl. No.: 457,596

[22] Filed: Jun. 1, 1995

Related U.S. Application Data

[62] Division of Ser. No. 960,694, Oct. 14, 1992, which is a division of Ser. No. 852,208, Jun. 4, 1992, Pat. No. 5,348, 618.

[30] Foreign Application Priority Data

Dec. 7, 1989 [GB] United Kingdom .............. 8927709

[51] Int. Cl.$^6$ .................................................. H01L 47/00
[52] U.S. Cl. ............................ 257/3; 257/14; 257/103
[58] Field of Search ............................. 257/3, 14, 103, 257/72, 82, 84, 90, 347, 351

[56] References Cited

U.S. PATENT DOCUMENTS

| | | |
|---|---|---|
| 4,751,194 | 6/1988 | Cibert et al. . |
| 5,324,965 | 6/1994 | Tompsett et al. .............. 257/103 |

OTHER PUBLICATIONS

Canham et al.; "Silicon Quantum Wire Array Fabrication by Electrochemical and Chemical Dissolution of Wafers;" Appl. Phys. Lett. 57 (10), 3 Sep. 1990; pp. 1046–1048.

Steiner et al.; "Blue and Green Electroluminescence from a Porous Silicon Device;" Electron Device Letters., vol. 14, No. 7, Jul. 1993.

Namavar et al.; "Visible Electroluminescence from Porous Silicon NP Heterojunction Diodes;" Appl. Phys. Lett. 60 (20), 18 May 1992; pp. 2514–2516.

Koshida et al.; "Visible Electroluminescence from Porous Silicon;" Appl. Phys. Lett. 60 (3), 20 Jan. 1992; pp. 347–349.

Lehmann et al.; "Porous Silicon Formation: A Quantum Wire Effect;" Appl. Phys. Lett. 58 (8), 25 Feb. 1991; pp. 856–858.

Bassous et al.; "Characterization of Microporous Silicon Fabricated by Immersion Scanning;" Mat. Res. Soc. Symp. Proc., vol. 256, 1992; pp. 23–26.

Richter et al.; "Visible Electroluminescence of Porous Silicon Devices with a Solid State Contact;" Mat. Res. Soc. Symp. Proc., vol. 256, 1992; pp. 209–214.

Harvey et al.; "Optical Studies of Electroluminescent Structures from Porous Silicon;" Mat. Res. Soc. Symp. Proc., vol. 263, 1993; pp. 395–399.

(List continued on next page.)

*Primary Examiner*—Sara W. Crane
*Attorney, Agent, or Firm*—Nixon & Vanderhye

[57] ABSTRACT

A method of making semiconductor quantum wires, and a light emitting device employing such wires, employs a semiconductor wafer as starting material. The wafer is weakly doped p type with a shallow heavily doped p layer therein for current flow uniformity purposes. The wafer is anodized in 20% aqueous hydrofluoric acid to produce a layer 5 microns thick with 70% porosity and good crystallinity. The layer is subsequently etched in concentrated hydrofluoric acid, which provides a slow etch rate. The etch increases porosity to a level in the region of 80% or above. At such a level, pores overlap and isolated quantum wires are expected to form with diameters less than or equal to 3 nm. When excited, the etched layer exhibits photoluminescence emission at photon energies well above the silicon bandgap (1.1 eV) and extending into the red region (1.6–2.0 eV) of the visible spectrum.

18 Claims, 6 Drawing Sheets

OTHER PUBLICATIONS

"Porous Silicon: The Material and its Applications to SOI Technologies", Microelectronic Engineering 8 (1988), pp. 293–310, Bomchil et al.

Physical Review Letters, "Unusually Low Surface–Recombination Velocity on Silicon and Germanium Surfaces", vol. 57, No. 2, 14 Jul. 1986, pp. 249–252.

"Porous Silicon: The Material and its Applications in Silicon–on–Insulator Technologies", Applied Surface Science 41/42 (1989), pp. 604–613 G. Bomchil et al.

Physical Review B, vol. 37, No. 14, "Hydrogen Desorption Kinetics from Monohydride and Dihydride Species on Silicon Surfaces", Gupta et al, pp. 8234–8243, May 15, 1988.

J. Phys. C: Solid States Physc., 17 (1984), pp. 6535–6552, "Optical Studies of the Structure of Porous Silicon Films formed in p–type Degenerate and Non–Degenerate Silicon", C. Pickering et al.

Furukawa et al.; "Three–Dimensional Quantum Well Effects in Ultrafine Silicon Particles"; Jap. Journal of Applied Physics, vol. 27, No. 11, Nov. 1988, pp. L2207–L2209.

Liu et al.; "Self–Limiting Oxidation of SI Nanowires"; J. Vac. Sci. Technol. B 11(6), Nov./Dec. 1993; pp. 2532–2537.

Potts et al.; "Fabrication of Free–Standing Single–Crystal Silicon Wires", Apply. Phys. Lett. 52(10), 7 Mar. 1988; pp. 834–835.

Furukawa et al.; "Quantum Size Effects on the Optical Band Gap of Microcrystalline SI:H"; Physic Review B, vol. 38, No. 8, 15 Sep. 1988; pp. 5726–5729.

Kapon et al.; "Stimulated Emission in Semiconductor Quantum Wire Heterstructures"; Physical Review Letters; vol. 63, No. 4; Jul. 24, 1989; pp. 430–433.

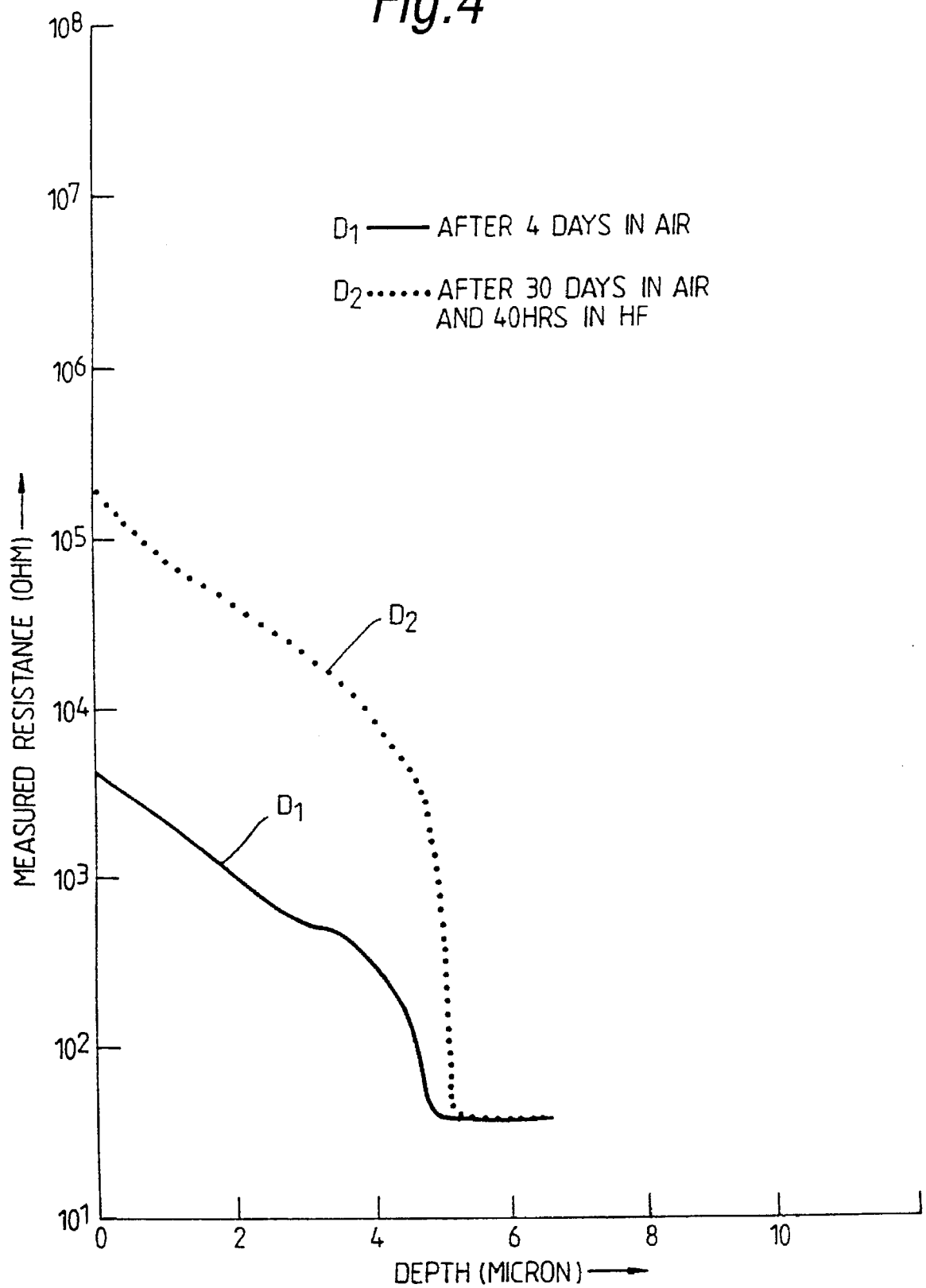

METHOD OF MAKING SILICON QUANTUM WIRES

This is a divisional of application Ser. No. 07/960,694, filed Oct. 14, 1992, which in turn is a divisional of application Ser. No. 07/852,208, filed Jun. 4, 1992, now U.S. Pat. No. 5,348,618.

BACKGROUND OF THE INVENTION

1. Field of the Invention

This invention relates to a method of making silicon quantum wires and to devices made by the method.

2. Discussion of Prior Art

Semiconductor quantum wires are a recent development in the emerging field of low dimensional semiconductor device structures. The first such structure was the one dimensional quantum well, in which a relatively narrow bandgap semiconductor layer is sandwiched between two relatively wider bandgap semiconductor layers. A typical quantum well layer thickness is in the range 1 to 10 nm. Charge carriers with energies intermediate the bandgaps of the two materials are free in the narrow bandgap material but would be bound in the wider bandgap material. This produces what is referred to as quantum confinement of charge carriers within a quantum well formed by a narrow bandgap layer. There is two-dimensional freedom for charge carriers within the plane of the layer, and one-dimensional confinement. This provides a quantum well layer or "quantum plane". One dimensional confinement effects in a-Si:H quantum well layers have been reported by Abeles and Tiedje in Physical Review Letters Vol. 51, pages 2003–2006 (1983). Structures containing many quantum well layers are often referred to as "superlattices". There are well established growth techniques available for fabricating Si-based superlattices.

It is also known to produce so-called silicon "quantum dots" in which there is three-dimensional confinement. Furukawa et al., in Phys. Rev. B38, p5726 (1988), report the production of very small crystalline particles of silicon with diameters in the range 2 nm to 5 nm and having hydrogen-passivated surfaces. This material has polyhedral or sphere-like grains, as indicated by transmission electron microscopy data, and extensive Si-H$_2$ surface chemical groups detected by infrared absorption. Its appearance is that of a pale yellow powder. It exhibits efficient room temperature photoluminescence in the red region of the visible spectrum, i.e. at photon energies well above the bulk silicon semiconductor bandgap. Photoconductivity and optical absorption data suggest that the optical bandgap is widened up to 2.4 eV, more than twice the 1.1 eV bulk silicon value.

One major reason for the interest in quantum confinement in semiconductors arises from the desire to create novel electronic and luminescent devices. Bulk undoped silicon is unfortunately characterized by very poor luminescent properties. Nevertheless, the is considerable interest in producing a silicon-based or silicon-compatible light emitting device for incorporation in opto-electronic integrated circuits. International Application No PCT/GB88/00319 published under the Patent Co-operation Treaty as No WO88/09060 relates to an electroluminescent device produced by creating luminescent defect centers in silicon by electron beam irradiation.

It is a requirement of materials for making electroluminescent devices that they have adequate electrical conductivity. They are required to carry appreciable electric currents at low to moderate voltages to create luminescence. In this regard, the prior art of Furukawa et al. is inappropriate. The quantum dot material has a resistivity greater than $10^{11}$ Ohm cm, many orders of magnitude above that appropriate for an acceptable semiconductor device. It seems unlikely that this can be significantly improved due to the difficulty of obtaining conduction between adjacent crystallites. This difficulty might be overcome in silicon quantum wires, which might provide better conductivity combined with similar quantum confinement effects.

The production of semiconductor quantum wire structures in the prior art has been directed to patterning superlattices by lithographic and etching techniques. Such work in the GaAs/AlGaAs ternary material system has been produced inter alia by Kapon et al. in Phys. Rev. Letters, Vol 63, 420 (1989). These authors disclose further processing of a one-dimensional quantum well structure (superlattice) to achieve two-dimensional confinement. A single quantum will layer was selectively etched to define quantum well lines or wires.

Free standing crystalline silicon wires have been reported by Potts et al., Appl Phys. Lett. 52, 834 (1988). The wires were produced by the use of electron beam lithography and plasma etching on recrystallized silicon-on-insulator films. Four wires were formed by patterning a silicon layer to define lines, and then undercutting the lines by etching. This defined wires with longitudinal dimensions parallel to the substrate and the original layer plane. However, the number of wires was very small, and the average wire diameter was 600 nm, more than two orders of magnitude above that required to exhibit above- bandgap luminescence in accordance with the prior art of Furukawa et al.

SUMMARY OF THE INVENTION

It is an object of the present invention to provide an alternative method of making silicon quantum wires.

The present invention provides a method of producing silicon quantum wires including the steps of:

(1) anodizing silicon material to produce a porous layer therein, and (2) etching the porous layer to widen the pores sufficiently to produce pore overlap thereby defining discrete quantum wires.

The invention provides the advantage that it is a simple but effective technique of producing silicon quantum wires particularly silicon quantum wires with diameters of 3 nm or less. Material processed in accordance with the invention has exhibited photoluminescence similar to that of Furukawa et al for quantum dots. This indicates that wire diameters in the region of 3 nm or less have been achieved.

Anodization may be carried out to produce porosity in the range 20% to 80%, and etching may then be performed at a rate in the range 0.0001 nm to 10 nm per minute to provide an increase in porosity to a value in the range 60% to 90%. The etch rate is preferably in the range 0.01 nm to 10 nm per minute. To minimize processing costs, the etch rate should be as high as possible consistent with the production of well-defined quantum wires. Anodization may be carried out in aqueous or ethanoic hydrofluoric acid of concentration in the range 10% to 50% by weight. An anodizing current density of 5 to 500 mAmp/cm$^2$ may be applied for 10 to 6000 seconds, as appropriate to requirements of layer thickness, porosity and conductivity magnitude and type.

In an alternative aspect, the invention also provides a semiconductor device made by a technique incorporating the method of the invention as aforesaid.

BRIEF DESCRIPTION OF THE DRAWINGS

In order that the invention might be more fully understood, examples thereof will now be described with reference to the accompanying drawings, in which:

FIG. 4 illustrates the increase of anodized silicon spreading resistance after exposure to air and HF etching;

DETAILED DISCUSSION OF PREFERRED EMBODIMENTS

Figure 1:
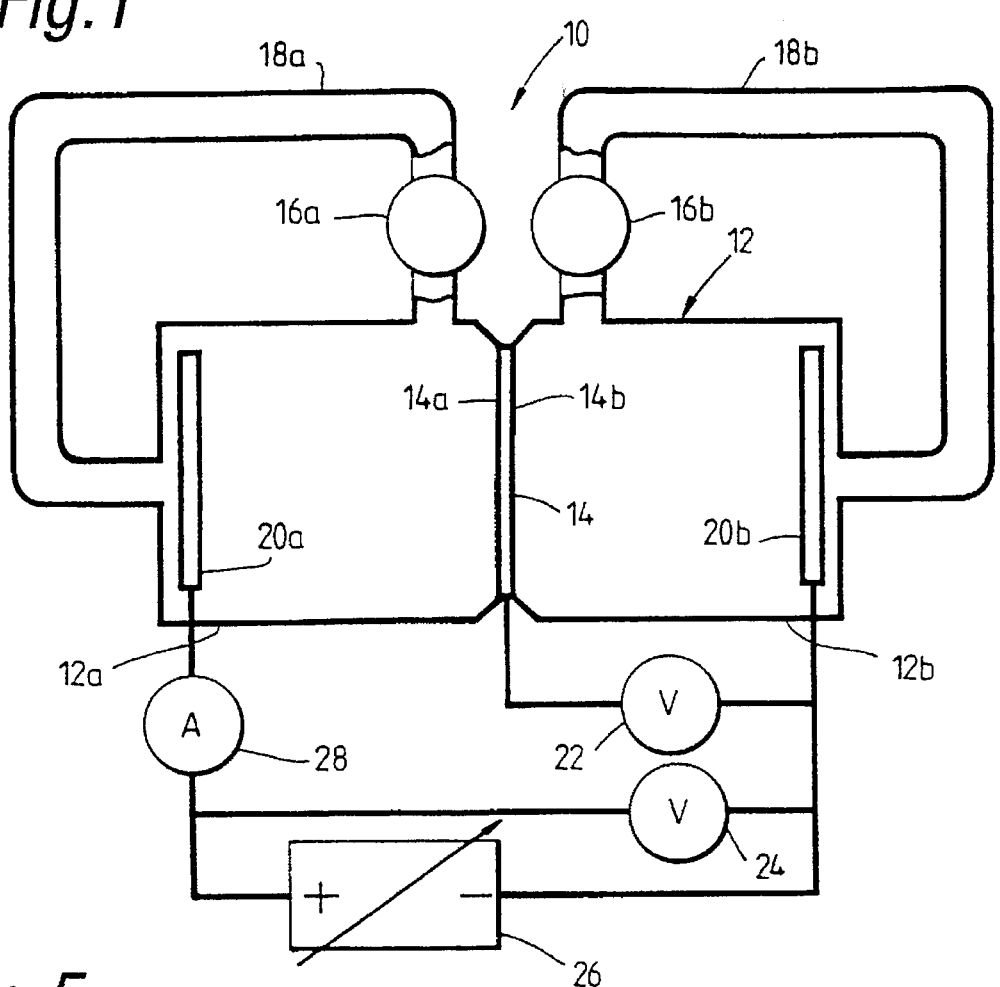
FIG. 1 is a schematic drawing of a silicon anodizing cell.

Referring to FIG. 1, an electrochemical apparatus 10 for processing semiconductor material in accordance with the invention is shown schematically. The apparatus 10 incorporates an electrochemical cell 12 divided into left and right: half cells 12a and 12b by a silicon wafer 14 to be processed. The half cells 12a and 12b are connected to dual purpose pumps 16a and 16b by pipes 18a and 18b respectively. Each combination of elements 12a/16a/18a and 12b/16b/18b forms a closed loop for electrolyte recirculation. The half cells 12a and 12b incorporate respective platinum electrodes 20a (anode) and 20b (cathode). A first voltmeter 22 is connected between the Si wafer 14 and the cathode 20b, and a second voltmeter 24 is connected between the anode 20a and the cathode 20b. A galvanostat 26, i.e. a constant current source, is connected in series with an ammeter 28, and this series arrangement is connected between the anode 20a and the cathode 20b.

The apparatus 10 is hinged (not shown) in the region of the wafer 14 to allow the wafer's insertion and removal. A synthetic rubber washer (not shown) provides a leak-tight seal between the wafer and the apparatus 10. In use, the apparatus 10 is mounted with a slight tilt to ensure bubble-free filling and complete draining.

The pumps 16a and 16b are also connected to respective electrolyte reservoirs (not shown) from which the half cells 12a and 12b are filled. After the half cells 12a and 12b have been filled, valves (not shown) are actuated to provide the electrolyte recirculation configuration shown. In operation, the left and right half cells 12a and 12b are both filled with a solution of 20% of hydrofluoric acid in water. Of these, the composition of the left half cell 12a is not critical, as will be described later. The cell 12 is constructed of materials resistant to hydrofluoric acid, i.e. largely PTFE. The wafer 14 forms a seal separating the electrolytes in the two half cells 12a and 12b.

The silicon wafer 14 is Czochralski-grown(CZ) material. It is produced from a standard three inch diameter wafer originally having weak p-type doping providing a resistivity in the range 30–50 Ohm cm as supplied by a manufacturer. The wafer has surfaces 14a and 14b, the surface 14a being less highly polished than the surface 14b. Prior to insertion in the electrochemical apparatus 10, the wafer 14 is given a doping pretreatment. Using an ion implantation facility, it is given a boron ion beam dose of $10^{15}$ B+ ions/cm$^2$ incident on surface 14a, the beam accelerating potential being 40 keV. After implantation, the wafer 14 is annealed in argon at 1050° C. for 30 minutes. This produces a heavily doped p layer (p+) below the wafer surface 14a at a depth which is shallow compared to the wafer thickness. The purpose of the p+ layer is to enhance uniformity of current flow through the wafer 14.

The wafer 14 is assembled in the apparatus 10 with its boron implanted surface 14a in the left half cell 12a. The pumps 16a and 16b are connected to their respective electrolyte reservoirs, and are operated to fill the half-cells 12a and 12b. Subsequently, the pumps 16a and 16b are connected as shown in FIG. 1, and are operated to recirculate the electrolytes continuously through the half cells 12a and 12b respectively. The galvanostat 26 is then switched on, and a constant current is passed through the cell 12 between the electrodes 20a and 20b via the wafer 14. The current is at a predetermined level giving a current density of 20 mA/cm$^2$ at the wafer 14.

The current in the cell 12 anodizes the non-implanted surface 14b of the Si wafer 14 in the half call 12b. It is passed through the cell for a period of five minutes, and produces an anodized layer 5 microns thick on the non-implanted surface. The anodized layer has a porosity of 70%, i.e. it has 30% of the density of bulk silicon. It is dark golden brown in color, and is of a crystalline quality approaching that of the underlying bulk silicon wafer material. It has more than $5 \times 10^{12}$ pores/cm$^2$, and pore width is less than 4 nm.

After formation of the anodized layer, the wafer 14 is removed from the apparatus 10, dipped in deionised water, and Spundry to remove physically adsorbed electrolyte. It is then subjected to chemical dissolution in the absence of light for an extended period. Dissolution is carried out for 6 hours in a concentrated solution of 40% by weight of hydrofluoric acid (HF) in water. Concentrated (48%) HF has been reported by Hu and Kerr in Journal of the Electrochemical Society, 114, page 414, (1967) to provide a slow etch rate of 0.03 nm/minute in n-type (20 Ohm-cm) bulk silicon. During the period of dissolution, the porosity of the anodized surface layer of the silicon wafer 14 gradually increases. As the porosity increases, the color of the anodized layer changes from dark golden brown initially, through bright yellow to pale yellow. The changes are visible to the naked eye, and the appearance of the pale yellow layer coloration is treated as indicating the end point of the dissolution process stage. After this stage, the physical properties of the HF-treated porous layer are consistent beth with a porosity greater than 80% and with the layer's incorporating quantum wires less than or equal to 3 nm in thickness.

The pale yellow color of the HF-treated porous layer is similar to that observed in "quantum dots" in the prior art of Furukawa et al previously referred to. The dots were reported as less than or equal to 3 nm in diameter, which provides an inference that wires produced in foregoing example are of like diameter.

Figure 8:
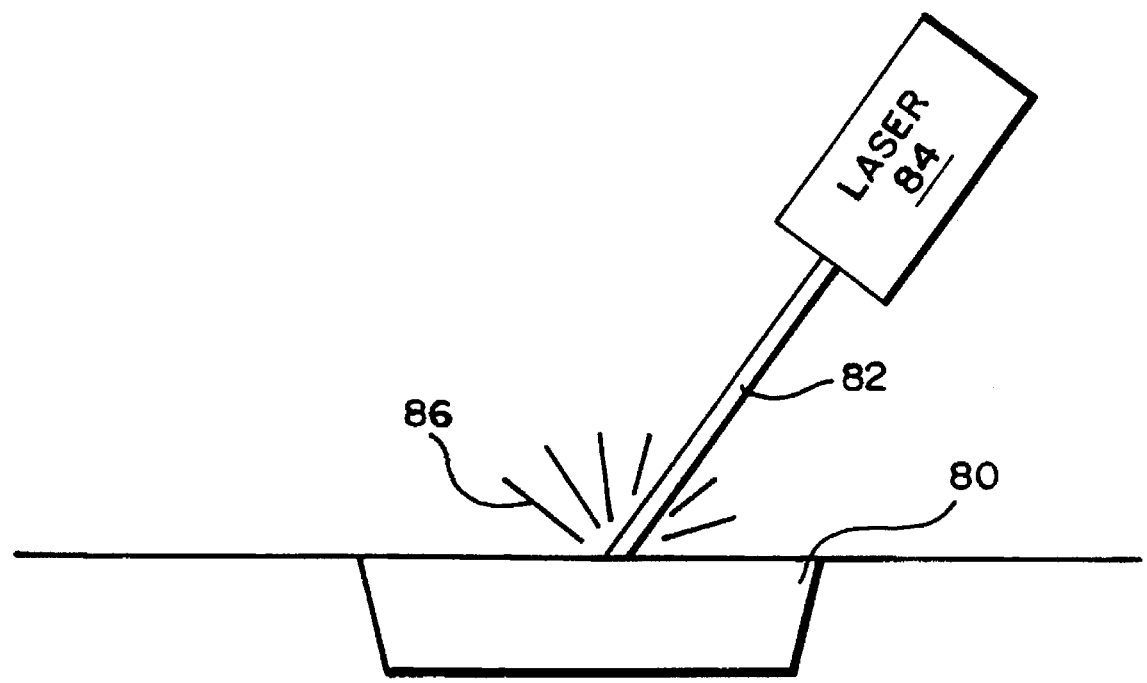
FIG. 8 illustrates luminescence generated by excited porous silicon.

As shown in FIG. 8, the HF-treated porous layer 80 was subjected to irradiation with light 82 of 514.5 nm wavelength from an argon ion laser 84. It exhibits efficient photoluminescence 86 peaking at about 0.78 microns (1.6 eV) and extending into the visible red spectral region. The visible red spectral region extends from 0.622 microns (1.99 eV) to 0.77 microns (1.61 eV). Here again similar photoluminescence results were obtained by Furukawa et al, who published a photograph showing room temperature red emission from quantum dots.

Figure 2:
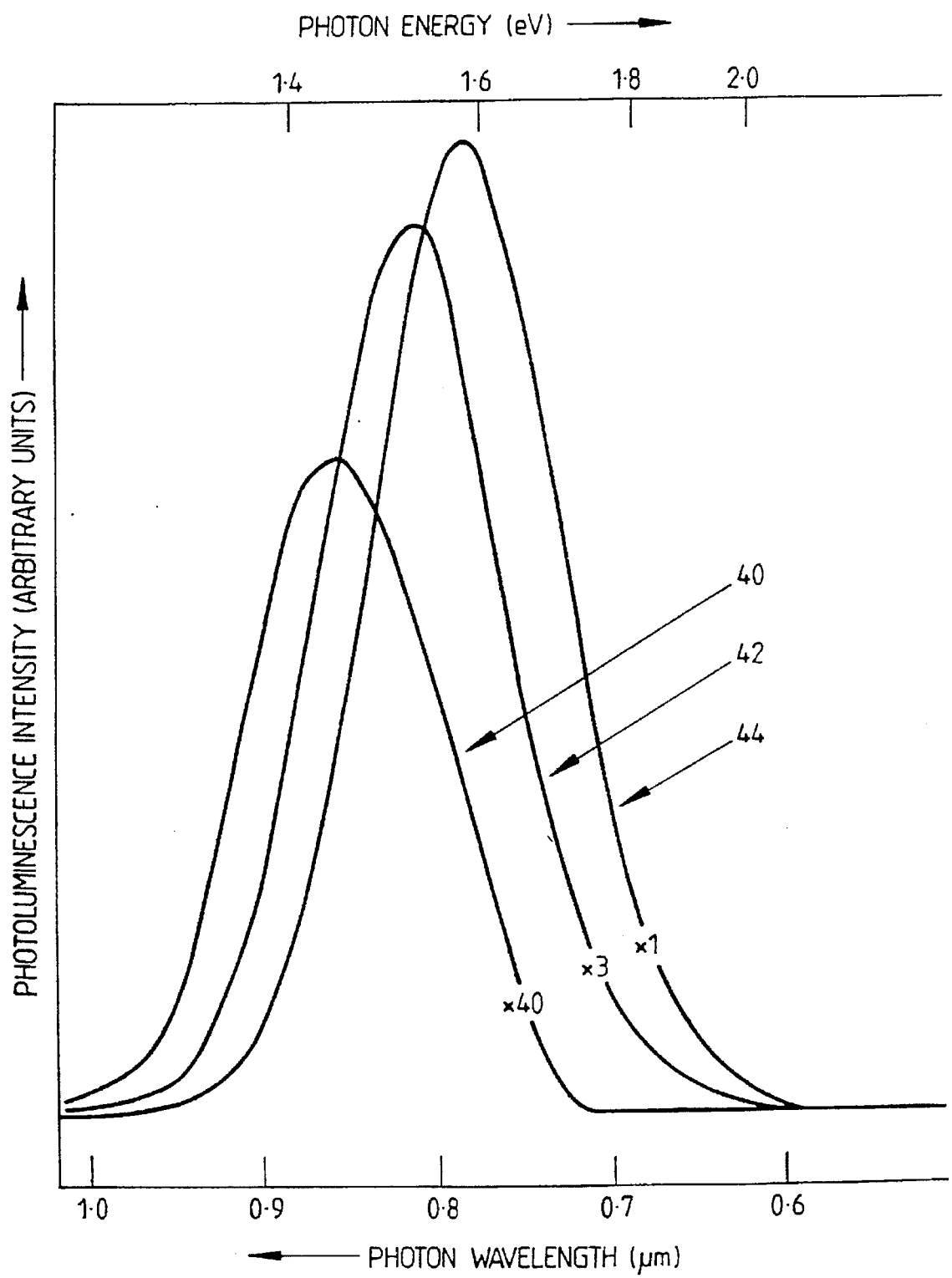
FIG. 2 shows photoluminescence spectra obtained from silicon processed in accordance with the invention.

Photoluminescence from specimens produced in accordance with the invention was studied as a function of HF dissolution time; i.e. a silicon wafer was anodized and subsequently cut into individual specimens for HF treatment for differing time intervals. The results of this for four such specimens is shown in FIG. 2, in which graphs of photoluminescence intensity (arbitrary units) are plotted against photon energy (ev) and wavelength (microns) as upper and lower abscissae respectively. The irradiating beam was of 514.5 nm wavelength from an argon ion laser as before. The measurements were made at 300K. The graphs are referenced 40, 42 and 44, and correspond to specimen dissolution times of 1, 2 and 6 hours respectively. It should be noted that graphs 40, 42 and 44 are multiplied by the factors 40, 3 and 1 respectively, as indicated on FIG. 2. As in the earlier example, the specimens were treated with 40% by weight HF in water. FIG. 2 demonstrates that the photoluminescence output increases and moves to shorter wavelengths and higher photon energies with increase in dissolution time. This is consistent with porosity increasing within the anodized layer with degree of dissolution and enhancing the quantum confinement of charge carriers to produce effective energy gap increase. Graph 44 (corresponding to 6 hour dissolution) indicates a substantial degree of visible red emission as observed from prior art silicon quantum dots. The energy gap of the bulk crystalline silicon is about 1.1 eV at room temperature and it has a near band gap photoluminescence peak at 1.09 eV. The peaks of the photoluminescence graphs 40 to 44 range from 1.4 eV to 1.6 eV and are consistent with greatly enlarged energy gaps compared with bulk silicon.

Electrical resistivity measurements were carried out on anodized and HF-treated specimens in order to verify that silicon processing in accordance with the invention produces increased porosity consistent with quantum wire formation. The resistivity measurement method used was the so-called "spreading resistance" technique. In this technique, two spaced apart probes each with a small contact area are placed on a semiconductor surface and the resistance between them is measured. The probe contact diameter is in the range 4 microns to 25 microns, and a dc bias in the range 5 mV to 25 mV is employed. The specimen, normally a silicon wafer, is bevelled at a shallow angle (10–20 minutes of arc) to its surface to expose underlying layer structure. The bevel is formed by grinding with abrasive paste. Resistance is then measured as a function of depth below the original surface of the silicon wafer, each measurement being associated with a respective like depth for both probe tips. Resistance may be converted to resistivity by multiplication by a predetermined empirical calibration factor. This technique is described in detail inter alia by Mazur and Gruberl, Solid State Technology, Nov. 1981, pages 64–70. It is appropriate for measurements on layer structures where properties vary between adjacent layers. It is a mature technology and will not be described further.

Figure 3:
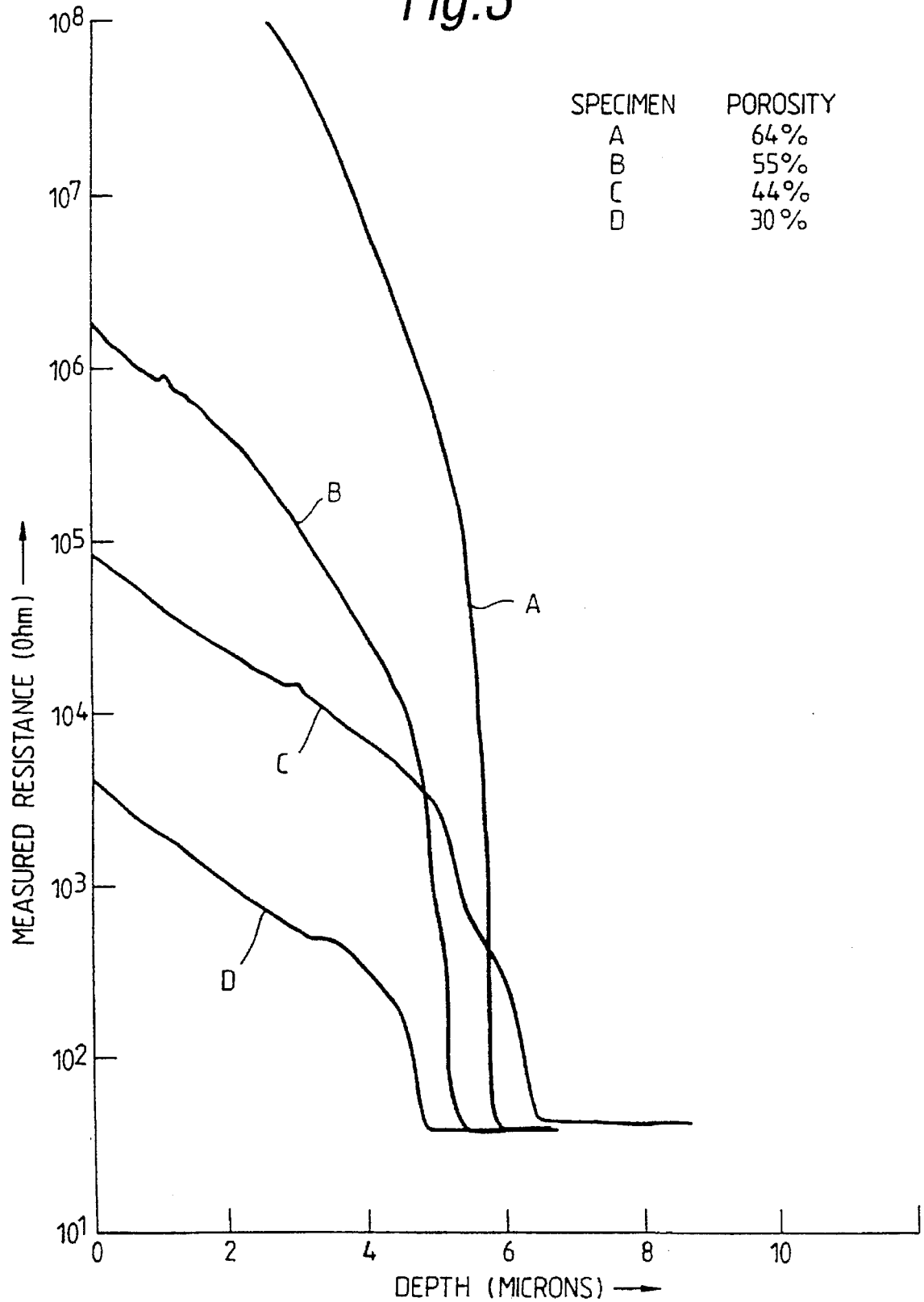
FIG. 3 illustrates the variation of spreading resistance with porosity in anodized silicon.

FIGS. 3 and 4 show results derived from spreading resistance measurements on anodized layers and on anodized+HF treated layers. The two-probe measuring technique referred to above was employed, the probe spacing being set at 50 microns. In FIG. 3, results for four specimens A, B, C and D are shown, these having surface layers with calculated porosities of 30%, 44%, 55% and 64% respectively. These surface layers were produced by anodization as described with reference to FIG. 1, the starting material being n+ (heavily doped n-type) silicon. There was however no subsequent HF dissolution treatment.

The porous layers of specimens A to D were approximately 5 microns in depth, and their porosities were calculated from weight loss during anodization. This involves calculating an effective density for each porous layer from its reduced weight over its volume, and then calculating porosity from the ratio of density reduction to bulk density; i.e.:

Porosity=$(d_b-d_e)/d_b$ where $d_b$=silicon bulk density=2.33 gm/cm$^3$, and $d_e$=porous layer effective density.

The above procedure for porosity determination is as in the art of porous silicon measurements.

FIG. 3 shows resistance plotted against depth (microns) in the relevant porous layer for each of the four specimens A to D. The upper limit of the equipment used was 10$^8$ Ohm, as indicated by a chain line. In each case, the respective porous layer had a nominal thickness of 5 microns. The measurements shown in FIG. 3 indicate that this thickness was about 5 microns in specimens B and D, 6 microns in specimen A and 6.5 microns in specimen C. The layer thickness is the depth at which the measured resistance falls to that of the underlying bulk n+ silicon, i.e. 50 Ohms approximately.

The graphs for specimens A to D in FIG. 3 demonstrate that resistance correlates with and is very sensitive to porosity. Very approximately, the resistance increases by an order of magnitude for each porosity increase of 10–15%. The resistance falls with increasing depth in each layer, e.g. between depths of 2 microns and 4 microns unaffected by the underlying bulk silicon. This may be due to a porosity gradient, a reduction in porosity with increasing depth arising from tapering pores or decreasing density of pores.

For the purposes of obtaining the data shown in FIG. 4, the wafer from which specimen D (30% porosity) of FIG. 3 was cut was employed to provide further samples treated in two-ways. Two specimens D$_1$ and D$_2$ were produced. Of these, D$_1$ had no HF dissolution treatment and measurements were made 4 days after anodization. Specimen D$_2$ was of anodized material allowed to stand for thirty days in air, and then subjected to HF dissolution for 40 hours in 40% HF by weight. No mechanical agitation was used, and immersion was in the absence of light. Resistance was measured as before as a function of depth in a bevelled layer. The specimen was bevelled after the foregoing treatments., In the region of 2 microns depth, the resistance increase between specimens D$_1$ and D$_2$ is fiftyfold. An increase in resistance has occurred throughout the porous layer depth (5 microns), in so far as this can be judged in the presence of measurement uncertainty. This indicates that the average porosity of the layer following storage in air and HF treatment has increased by about 10% and also that HF dissolution has occurred throughout the layer.

More direct evidence of increased pore size following the processing of porous silicon layers by etching in HF is provided by a gas adsorption-desorption analysis. The technique used, BET gas analysis, is a well known technique which is described in detail in "Adsorption, Surface Area and Porosity" by S J Gregg and K S W Sing, 2nd edition Academic Press (1982). Nitrogen adsorption-desorption isotherms can provide reliable estimates of pore width distributions for pore widths in the range 4 to 20 nm. The presence of pores with widths less than 4 nm can also be demonstrated by this technique, but no accurate indication of pore size is produced.

Three p+ wafers (E, F and G) were anodized, as described with reference to FIG. 1, in 40% by weight aqueous HF at 100 mAcm$^{-2}$ for 1 minute. Wafer E was destructively tested to obtain accurate measurements of the porous layer thickness and porosity. This testing yielded a layer thickness of 8.9 μm and a porosity of 33%.

Wafer underwent HF dissolution treatment, (70 hrs quiescent immersion in the dark in 40% by weight aqueous HF). During treatment the wafer lost 23.6 mg in weight, indicating an increase of average porosity from 33% to 63%.

Wafers F and G then underwent BET gas analysis. The results for wafer G indicated that all pores had diameters less than 4 nm.

Figure 5:
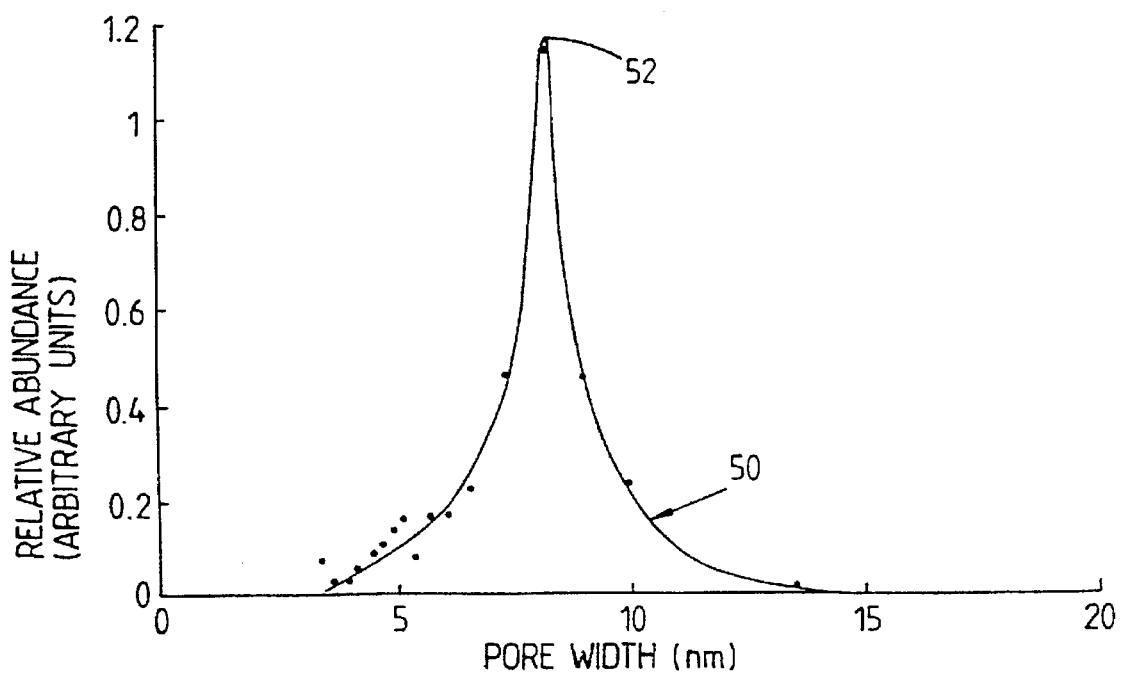
FIG. 5 illustrates the distribution of pore widths in a porous layer after anodization and etching.

Referring now to FIG. 5 there is shown a curve 50 of relative abundance (arbitrary units) against pore width (nm). This indicates the distribution of pore widths in wafer F and was determined by analysis of results of the BET gas analysis. Curve 50 shows a spread of pore widths from 4 nm up to 15 nm, with a peak 52 at 8 nm. This provides evidence that the HF treatment of porous silicon layers described above does lead to increase in pore widths and that such pore enlargement occurs throughout the porous layer.

Scanning electron microscopy was subsequently employed to measure the thickness of the porous layers of wafers F and G in order to check that the weight loss was not due to thinning of the porous layer on wafer F rather than increase in pore size. The results obtained gave the thickness of the porous layers at 8.6±0.3 μm and 8.4±0.3 μm for wafers G and F respectively, confirming that the porous layer of wafer F had not been significantly thinned during HF treatment.

The example of the method of the invention described with reference to FIG. 1 employed the following:
(1) p⁻ silicon wafer 14 with shallow p⁺ layer below surface 14a for current density uniformity purposes,
(2) anodization in 20% aqueous HF to produce 70% porosity, and
(3) chemical dissolution in 40% by weight HF in water (i.e., concentrated aqueous HF) to produce porosity greater than 80%, and quantum wires with widths of 3 nm or less.

More generally, silicon of any conductivity type or doping level may be employed. The anodizing electrolyte may be aqueous or ethanoic (ethanol-dissolved) HF of strength. 10–50%. The electrolyte in the left half cell 12a is not critical, as it is only required for conduction to the anode 20a. The conditions under which silicon may be anodized are well-known. They are described inter alia by Beale et al. in the Journal of Crystal Growth 73 (1985) pages 622 to 636, published by North-Holland, Amsterdam. Broadly speaking, the conditions disclosed therein are suitable for use in the anodizing step of the present invention, subject to the following overriding considerations. Electrochemical dissolution (i.e., anodization) is employed to achieve porosity in the range 20% to 80%, corresponding to silicon density between 1.9 and 0.5 gm/cm$^3$. The anodizing current density may be in the range 0.5–500 mAmp/cm$^2$, and the anodizing time in the range 10–6000 seconds depending on layer thickness and porosity required and substrate resitivity. Subsequently, chemical dissolution is employed to increase porosity to a value in the range 60% to 90% and to produce quantum wires with widths of 3 nm or less. A slow etchant is employed, preferably one suitable to provide an etch rate in the range 0.0001 nm to 10 mn per minute.

Figure 6:
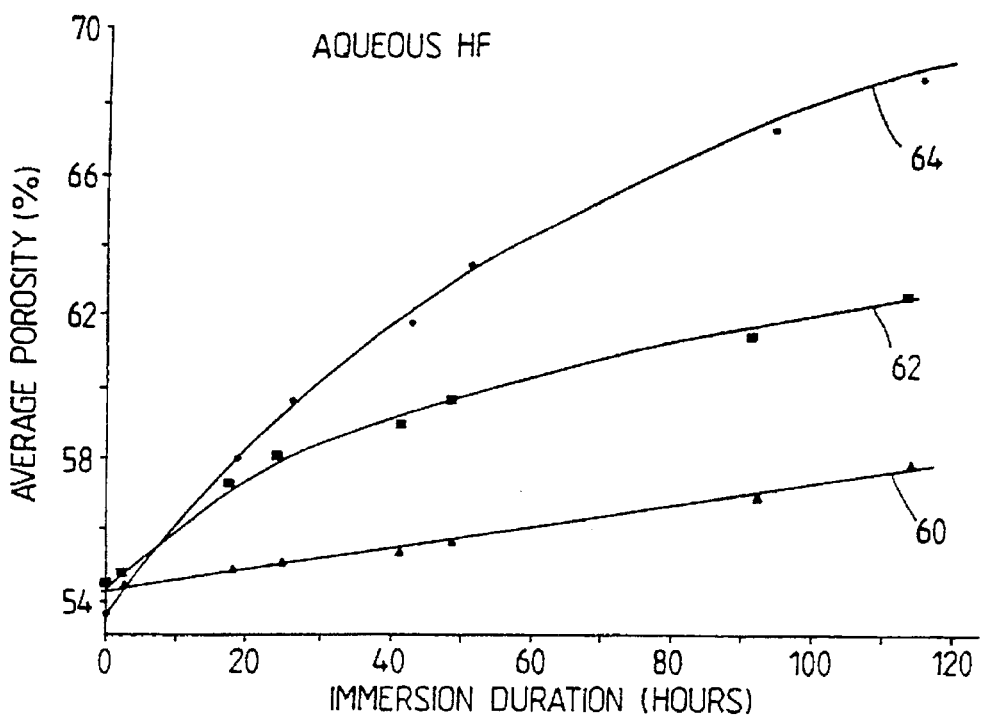
FIGS. 6 and 7 illustrates the variation in etch rate with HF concentration and differing diluents.
Figure 7:
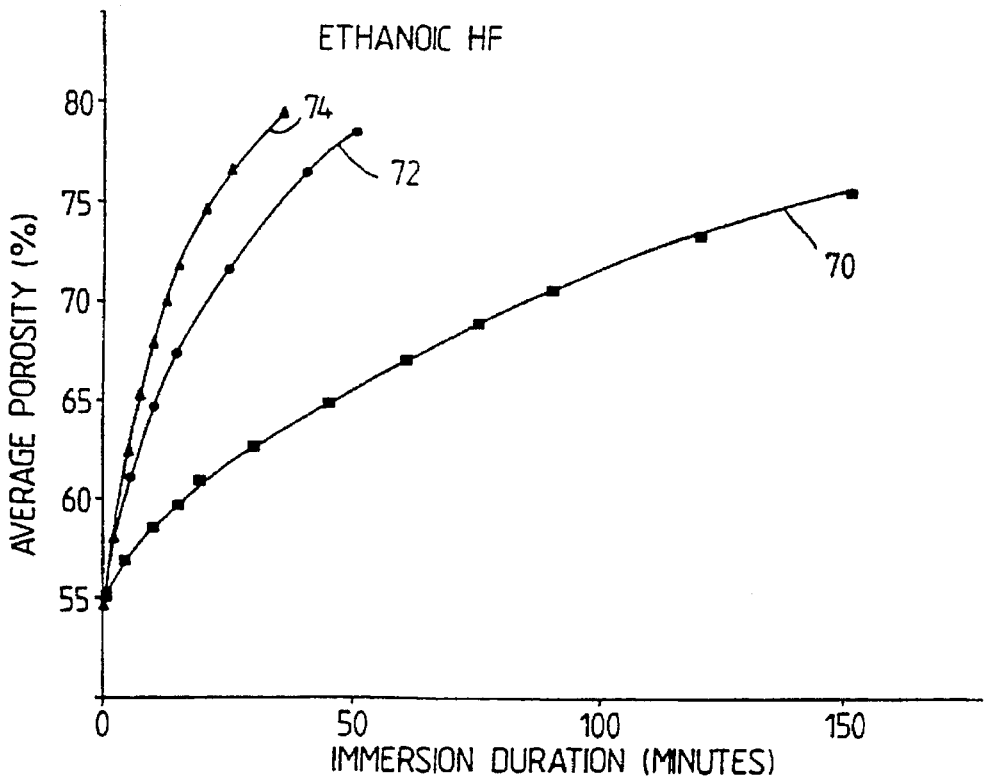

Referring now to FIGS. 6 and 7, these provide the variation in silicon porosity of a particular layer with duration of quiescent immersion in various etchants. The layer had an initial porosity of 54±1% and a thickness of 6.2±0.2 μm and is produced by anodizing p⁺ (0.01 to 0.04 Ohm cm) wafers in 20% ethanoic HF at 8.5 mAcm$^{-2}$ for 10 minutes. Thus FIGS. 6 and 7 illustrate the variation in silicon etch rate with HF concentration and diluent. In both figures, porosity calculated from the results of gravimetric analysis is plotted against silicon immersion duration for various etchant strengths. FIG. 6 relates to aqueous HF diluent and FIG. 7 to ethanol HF diluent. Graphs 60, 62 and 64 in FIG. 6 show porosity/time variation for silicon in etchants consisting of 50%, 40% and 20% aqueous HF respectively. Graphs 70, 72 and 74 in FIG. 7 show silicon porosity/time variation for respective etchants consisting of 40% by weight aqueous HF diluted with ethanol and water to 20%, 10% and 6.7% HF.

It should be noted that the abscissae of FIGS. 6 and 7 whilst both being immersion duration have the units of hours and minutes respectively. Graphs 60 to 64 and 70 to 74 clearly illustrate an increase in etch rate of HF solutions with reduction in HF content. Comparison between graphs 60 to 64 and 70 to 74 clearly illustrates a dramatic increase in etch rate when ethanol is used as diluent. The graphs 60 to 64 and 70 to 74 therefore indicate that etch rate may be controlled by appropriate selection of etchant concentration and diluent. The concentration of HF in solution may be selected from a wide range e.g. 6.7% to 50%.

Chemical dissolution may be achieved by immersing the wafer to be treated in the etchant in its liquid or vapor phases. Indeed when a wafer is immersed in liquid etchant, the liquid may not penetrate and may not wet the pores totally or even partially. The addition of a surfactant may therefore be necessary in order to achieve the desired etch rate. A suitable surfactant is perfluoroalkylsulphonate which is known for use in HF solutions in the semiconductor processing industry. It should be noted that a surfactant, such as that indicated above, may also be added to the electrolyte.

The foregoing description provided evidence for the creation of silicon quantum wires based on the reproduction of properties reported for silicon quantum dots by Furukawa et al. These properties related to pale yellow coloration and visible red photoluminescence at photon energies well in excess of the silicon bandgap. There is also geometrical evidence for the production of silicon quantum wires. Porous silicon may be considered in a simplified model as bulk silicon containing parallel cylindrical holes. As porosity is increased by etching away cylinder walls, eventually the wall thickness between adjacent pores becomes zero. At this point, individual quantum wires are defined, each being the material left between three or four neighboring merged pores. The lowest porosity of this idealized structure at which individual pores merge and inter-pore wall thickness becomes zero is 78.5% irrespective of pore radius (provided radii are equal). For four neighboring merged pores, the wire thickness is $2(2^{1/2}-1)r$. Pore radii can be less than 2 nm in p⁻ silicon of porosity in the region of 60% for example. It is therefore anticipated that silicon quantum wires would be produced whenever the porosity exceeded 78.5%. In practice, because of statistical distributions of pore sizes, spacings and directions, quantum wires may be expected anywhere in this porosity region, i.e. near or above 78.5%. It is assumed that the pores are initially well dispersed throughout the silicon material, and that chemical dissolution does not result in large voids spaced apart by bulk silicon. However, well-dispersed small pores are a common feature of anodized silicon, so the etching of such pores is reasonably expected to increase their size in a controlled manner to produce pore overlap rather than large voids. This is supported by the results of the BET gas analysis.

We claim:
1. A light emitting device comprising:
   silicon material at least a portion of which comprises porous silicon, said porous silicon having a porosity of at least 60% and incorporating silicon quantum wires having a thickness of less than 3 nm; and
   means for exciting said porous silicon to emit light.

2. A luminescent device comprising silicon material at least a portion of which comprises porous silicon, said porous silicon having a porosity of at least 60% and incorporating silicon quantum wires, wherein the porous silicon is luminescent at a temperature of 300K and luminescence from the device is visible.

3. A luminescent device comprising silicon material at least a portion of which comprises porous silicon, said porous silicon having a porosity of at least 60% and incorporating silicon quantum wires having a thickness of less than 3 nm, wherein the porous silicon is luminescent at a temperature of 300K and luminescence from the device is visible.

4. Luminescent porous silicon having a porosity of at least 60% and wherein the porous silicon is visibly luminescent at a temperature of 300K.

5. Luminescent porous silicon according to claim 4 wherein said porous silicon has a porosity of at least 78.5%.

6. Luminescent porous silicon according to claim 4 wherein said porous silicon has a porosity of at least 80%.

7. Luminescent porous silicon according to claim 4 wherein said porous silicon incorporates silicon quantum wires having a thickness of less than 3 nm.

8. Luminescent porous silicon according to claim 4 wherein said porous silicon is luminescent to produce electromagnetic radiation having a wavelength of less than 780 nm.

9. Luminescent porous silicon according to claim 4 wherein said porous silicon comprises a distribution of pores having a pore-width in the range 4 nm to 15 nm.

10. A silicon composite structure comprising:
(a) a silicon substrate; and
(b) a region of porous silicon adjacent said silicon substrate having a porosity of at least 60% and being visibly luminescent at a temperature of 300K.

11. A silicon composite structure according to claim 10 wherein the silicon substrate is p-type.

12. A silicon composite structure according to claim 11 wherein the p-type silicon substrate has a resistivity in the range 30 to 50 ohm cm.

13. A silicon composite structure according to claim 10 wherein the porous silicon region has a thickness in the image 5 µm to 8.9 µm.

14. The light emitting device of claim 1, in which said means for exciting comprises a laser.

15. The light emitting device of claim 14, wherein said laser is an argon ion laser.

16. The light emitting device of claim 15, wherein said argon ion laser has a wavelength of 514.5 nm and said emitted light is in the visible red spectral region.

17. A light emitting device comprising:
silicon material at least a portion of which comprises porous silicon, said porous silicon having a porosity of at least 60% and incorporating silicon quantum wires having a thickness of less than 3 nm; and
a porous silicon exciter, said exciter exciting said porous silicon to emit light.

18. A light emitting device in accordance with claim 17, wherein said exciter is an argon ion laser.

* * * * *

UNITED STATES PATENT AND TRADEMARK OFFICE
CERTIFICATE OF CORRECTION

| | |
|---|---|
| PATENT NO. | : 5,627,382 |
| APPLICATION NO. | : 08/457596 |
| DATED | : May 6, 1997 |
| INVENTOR(S) | : Canham et al. |

Page 1 of 1

It is certified that error appears in the above-identified patent and that said Letters Patent is hereby corrected as shown below:

On the Title page, "Related U.S. Application Data" should read:

Item [62] Division of Ser. No. 960,694, Oct. 14, 1992, which is a continuation of Ser. No. 852,208, Jun. 4, 1992, Pat. No. 5,348,618"

Signed and Sealed this
Tenth Day of January, 2012

David J. Kappos
*Director of the United States Patent and Trademark Office*